(12) United States Patent
Taguchi et al.

(10) Patent No.: US 10,971,703 B2
(45) Date of Patent: *Apr. 6, 2021

(54) LIGHT-EMITTING DEVICE HAVING INTERMEDIATE LAYER LOCATED OVER INTERCONNECT

(71) Applicants: PIONEER CORPORATION, Tokyo (JP); TOHOKU PIONEER CORPORATION, Yamagata (JP)

(72) Inventors: Junji Taguchi, Yonezawa (JP); Hiroki Tan, Yonezawa (JP); Noriaki Waki, Yonezawa (JP); Masaki Takahashi, Yonezawa (JP)

(73) Assignees: PIONEER CORPORATION, Tokyo (JP); TOHOKU PIONEER CORPORATION, Tendo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/730,781

(22) Filed: Dec. 30, 2019

(65) Prior Publication Data

US 2020/0144551 A1   May 7, 2020

Related U.S. Application Data

(63) Continuation of application No. 16/221,352, filed on Dec. 14, 2018, now Pat. No. 10,553,828, which is a
(Continued)

(51) Int. Cl.
*H01L 27/32* (2006.01)
*H01L 51/52* (2006.01)
(Continued)

(52) U.S. Cl.
CPC ...... *H01L 51/5275* (2013.01); *H01L 27/3283* (2013.01); *H01L 51/0096* (2013.01);
(Continued)

(58) Field of Classification Search
CPC ... H01L 22/12; H01L 32/32; H01L 272/3209; H01L 27/3253
See application file for complete search history.

(56) References Cited

U.S. PATENT DOCUMENTS 8,471,457 B2   6/2013 Yamamoto
10,553,828 B2 * 2/2020 Taguchi .............. H01L 51/0096
(Continued)

FOREIGN PATENT DOCUMENTS

JP   2002270377 A   9/2002
JP   2005183048 A   7/2005
(Continued)

OTHER PUBLICATIONS

International Search Report and Written Opinion for related PCT App No. PCT/JP2015/059240 dated May 19, 2015, 9 pgs.

*Primary Examiner* — Hoai V Pham
(74) *Attorney, Agent, or Firm* — Procopio, Cory, Hargreaves & Savitch LLP

(57) ABSTRACT

A substrate (100) is a light-transmitting substrate. A light-transmitting first electrode (110) is formed over the substrate (100). An insulating layer (150) is formed over the substrate (100) and the first electrode (110) and includes an opening (152) overlapping the first electrode (110). An organic layer (120) is located within at least the opening (152). A light-transmitting second electrode (130) is formed over the organic layer (120). An intermediate layer (200) is formed in at least a portion of a region of a lateral side of the first electrode (110) overlapping the first electrode (110). A refractive index of the intermediate layer (200) is between a refractive index of the substrate (100) and a refractive index of the first electrode (110).

11 Claims, 13 Drawing Sheets

Related U.S. Application Data continuation of application No. 15/560,967, filed as application No. PCT/JP2015/059240 on Mar. 25, 2015, now Pat. No. 10,186,687.

(51) Int. Cl.
*H01L 51/50* (2006.01)
*H05B 33/22* (2006.01)
*H05B 33/28* (2006.01)
*H01L 51/00* (2006.01)

(52) U.S. Cl.
CPC .......... *H01L 51/50* (2013.01); *H01L 51/5206* (2013.01); *H01L 51/5209* (2013.01); *H01L 51/5234* (2013.01); *H05B 33/22* (2013.01); *H05B 33/28* (2013.01); *H01L 2251/301* (2013.01); *H01L 2251/303* (2013.01); *H01L 2251/308* (2013.01); *H01L 2251/558* (2013.01)

(56) References Cited

U.S. PATENT DOCUMENTS

| | | |
|---|---|---|
| 2008/0018231 A1 | 1/2008 | Hirakata |
| 2009/0052195 A1 | 2/2009 | Saneto et al. |
| 2010/0295446 A1 | 11/2010 | Yamamoto |

FOREIGN PATENT DOCUMENTS

| | | |
|---|---|---|
| JP | 2008016347 A | 1/2008 |
| JP | 2009110930 A | 5/2009 |
| JP | 2009181856 A | 8/2009 |
| JP | 2011096680 A | 5/2011 |
| JP | 2014198423 A | 10/2014 |
| JP | 2014225329 A | 12/2014 |
| WO | 2011111670 A1 | 9/2011 |

* cited by examiner

LIGHT-EMITTING DEVICE HAVING INTERMEDIATE LAYER LOCATED OVER INTERCONNECT

RELATED APPLICATION INFORMATION

This application is a continuation of application Ser. No. 16/221,352 filed on Dec. 14, 2018, which is a continuation application of Ser. No. 15/560,967 filed Sep. 22, 2017, U.S. Pat. No. 10,186,687, Issued Jan. 22, 2019, which is a National Stage Entry of International Application No. PCT/JP2015/059240 filed on Mar. 25, 2015, and the disclosures of which are incorporated herein by reference in their entirety.

TECHNICAL FIELD

The present invention relates to a light-emitting device.

BACKGROUND ART

In recent years, there has been progress in the development of light-emitting devices using an organic EL element as a light-emitting unit. The organic EL element has a configuration interposing an organic layer between a first electrode and a second electrode. Such a light-emitting device may require transparency depending on its application. In order to make the light-emitting device transparent, the first electrode and the second electrode may be formed of a transparent conductive material.

On the other hand, in a case where the light-emitting device is made transparent, the edge of an electrode of an organic EL element may become conspicuous. In consideration thereof, Patent Document 1 discloses providing a correction layer in a region where no cathode is formed, the correction layer having the same material and thickness as those of the cathode. As an example of the cathode, a thin film of a metal such as magnesium, aluminum, or calcium having a low work function is disclosed. The correction layer is formed on the cathode with an insulating layer interposed therebetween.

Meanwhile, Patent Document 2 discloses a substrate provided with a transparent electrode, composed of a refractive index control layer and a transparent electrode layer formed in order on a transparent substrate. In Patent Document 2, the average refractive index of the refractive index control layer is 1.45 to 1.60. In addition, the refractive index control layer is formed as a laminate of two or more kinds of layers, the entire film thickness being 1,000 to 2,500 nm.

RELATED DOCUMENTS

Patent Documents

[Patent Document 1]: Japanese Unexamined Patent Application Publication No. 2002-270377
[Patent Document 2] Japanese Unexamined Patent Application Publication No. 2014-198423

SUMMARY OF THE INVENTION

Technical Problem

According to Patent Document 2, non-visibility of the transparent electrode layer, when seen from the transparent substrate side, is improved by the refractive index control layer. However, in general, an insulating layer and an electrode forming a light-emitting unit have different refractive indexes. For this reason, the refractive index difference at an interface between the refractive index control layer and the insulating layer, and the refractive index difference at an interface between the refractive index control layer and the electrode are different from each other. Therefore, when viewed from a side opposite to the transparent substrate side, the edge of the electrode may become conspicuous.

The exemplified problem to be solved by the present invention is to render an edge of an electrode less conspicuous when seen from a side opposite to a transparent substrate side and to prevent reduction in light extraction efficiency of a light-emitting device.

Solution to the Problem

According to the invention of claim 1, there is provided a light-emitting device including:
 a light-transmitting substrate;
 a light-transmitting interconnect positioned over the substrate;
  an insulating layer positioned over the substrate and the interconnect; and
 an intermediate layer positioned in at least a portion of a region of a lateral side of the interconnect that overlaps the insulating layer,
 wherein a refractive index of the intermediate layer is between a refractive index of the interconnect and a refractive index of the insulating layer.

BRIEF DESCRIPTION OF THE DRAWINGS

The above and other objects, features and advantages will be made clearer from certain preferred embodiments described below, and the following accompanying drawings.

DESCRIPTION OF EMBODIMENTS

Figure 1:
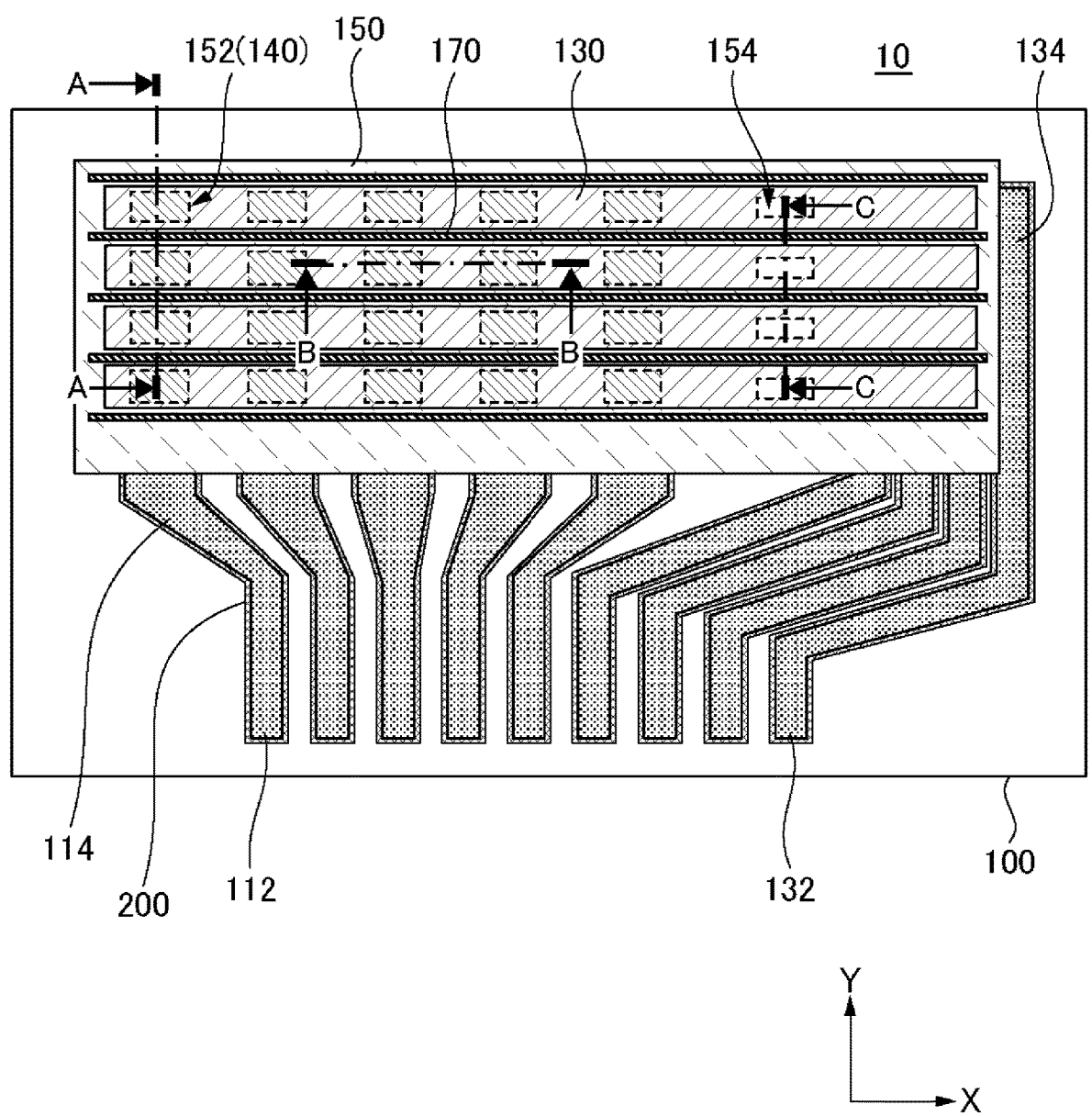
FIG. 1 is a plan view illustrating a configuration of a light-emitting device according to an embodiment.

Hereinafter, an embodiment of the present invention will be described with reference to the accompanying drawings. In all the drawings, like elements are referenced by like reference numerals and the descriptions thereof will not be repeated. In addition, in the following description, having a light-transmitting property, being light-transmitting, or transmitting light means transmitting at least visible light.

Figure 2:
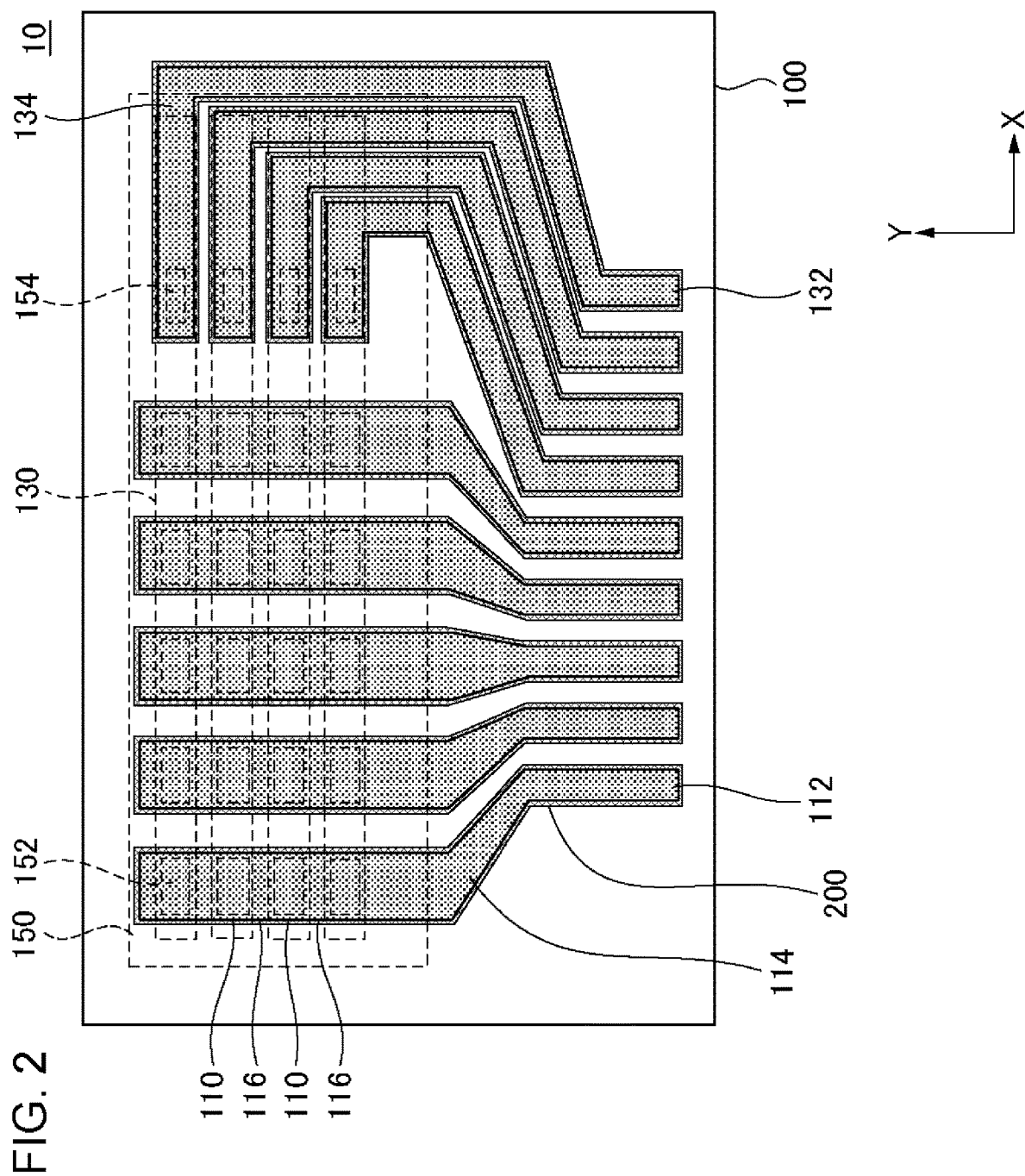
FIG. 2 is a diagram in which a partition wall, an insulating layer, and a second electrode are removed from FIG. 1.
Figure 3:
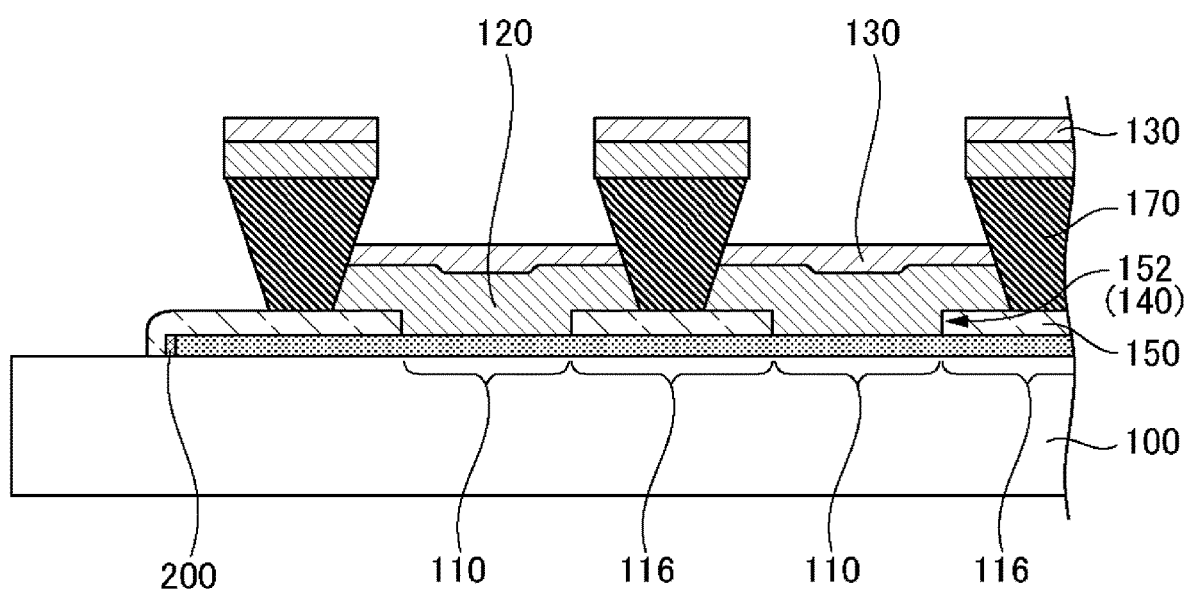
FIG. 3 is a cross-sectional view taken along line A-A of FIG. 1.
Figure 4:
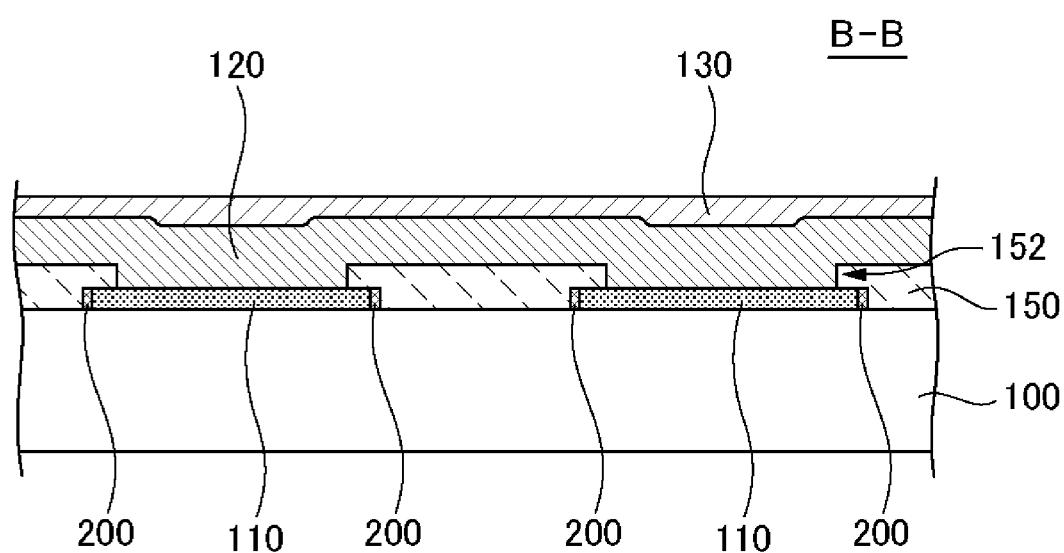
FIG. 4 is a cross-sectional view taken along line B-B of FIG. 1.
Figure 5:
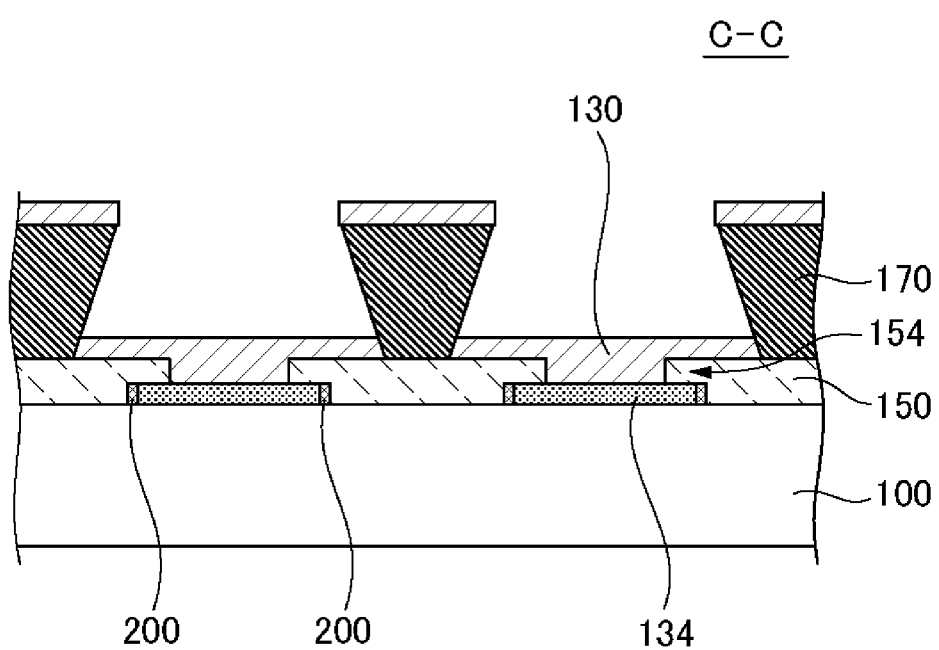
FIG. 5 is a cross-sectional view taken along line C-C of FIG. 1.

FIG. 1 is a plan view illustrating a configuration of a light-emitting device 10 according to an embodiment. FIG. 2 is a diagram in which a partition wall 170, an insulating layer 150, and a second electrode 130 are removed from FIG. 1. FIG. 3 is a cross-sectional view taken along line A-A of FIG. 1, FIG. 4 is a cross-sectional view taken along line B-B of FIG. 1, and FIG. 5 is a cross-sectional view taken along line C-C of FIG. 1.

The light-emitting device 10 according to the embodiment includes a substrate 100, a first electrode 110, an insulating layer 150, an organic layer 120, a second electrode 130, and an intermediate layer 200. The substrate 100 is light-transmitting. The first electrode 110 is formed on the substrate 100 and has a light-transmitting property. The insulating layer 150 is formed over the substrate 100 and the first electrode 110 and includes an opening 152 overlapping the first electrode 110. The organic layer 120 is located within at least the opening 152. The second electrode 130 is formed over the organic layer 120 and has a light-transmitting property. The intermediate layer 200 is formed in at least a portion of a region of the lateral side of the first electrode 110 which overlaps the insulating layer 150. The refractive index of the intermediate layer 200 is between the refractive index of the first electrode 110 and the refractive index of the insulating layer 150.

In addition, the light-emitting device 10 includes an interconnect 116. The interconnect 116 is formed on the substrate 100 and has a light-transmitting property. The insulating layer 150 is formed also on the interconnect 116. The intermediate layer 200 is formed in at least a portion of a region of the lateral side of the interconnect 116 which overlaps the insulating layer 150. The refractive index of the intermediate layer 200 is between the refractive index of the interconnect 116 and the refractive index of the insulating layer 150. Hereinafter, a detailed description will be given.

The light-emitting device 10 according to the embodiment is a display device, and includes the substrate 100, the first electrode 110, plural first terminals 112, plural second terminals 132, a light-emitting unit 140, the insulating layer 150, plural openings 152, plural openings 154, plural lead-out interconnections 114, the organic layer 120, the second electrode 130, plural lead-out interconnections 134, and plural partition walls 170.

The substrate 100 is formed of a light-transmitting material such as, for example, a glass or a light-transmitting resin. The substrate 100 is polygonal such as, for example, rectangular. The substrate 100 may have flexibility. In a case where the substrate 100 has flexibility, the thickness of the substrate 100 is, for example, equal to or greater than 10 μm and equal to or less than 1,000 μm. Particularly, in a case where the substrate 100 is formed of glass, the thickness of the substrate 100 is, for example, equal to or less than 200 μm. In a case where the substrate 100 is a resin, the substrate 100 is formed using, for example, polyethylene naphthalate (PEN), polyether sulphone (PES), polyethylene terephthalate (PET), or polyimide. In addition, in a case where the substrate 100 is a resin, an inorganic barrier film of SiNx, SiON or the like is formed on at least one surface (preferably, both surfaces) of the substrate 100 in order to prevent moisture from permeating the substrate 100. In a case where the substrate 100 is a glass substrate, the refractive index $n_1$ of the substrate 100 is, for example, equal to or greater than 1.4 and equal to or less than 1.6.

The light-emitting unit 140 is formed on the substrate 100 and includes an organic EL element. The organic EL element has a configuration in which the first electrode 110, the organic layer 120, and the second electrode 130 are laminated in this order.

The first electrode 110 is a transparent electrode which is formed on the substrate 100 and has a light-transmitting property. A transparent conductive material constituting the transparent electrode is a material including a metal, for example, a metal oxide such as an indium tin oxide (ITO), an indium zinc oxide (IZO), an indium tungsten zinc oxide (IWZO), or a zinc oxide (ZnO). The thickness of the first electrode 110 is, for example, equal to or greater than 10 nm and equal to or less than 500 nm. The first electrode 110 is formed using, for example, sputtering or vapor deposition using a mask. Meanwhile, the first electrode 110 may be a thin metal material (for example, Ag or an Ag alloy), carbon nanotubes, or a conductive organic material such as PEDOT/PSS. The refractive index $n_2$ of the first electrode 110 is greater than the refractive index $n_1$ of the substrate 100, and is, for example, equal to or greater than 1.8 and equal to or less than 2.2.

The first electrode 110 linearly extends in a first direction (Y direction in FIGS. 1 and 2). An end of the first electrode 110 is electrically and physically connected to the lead-out interconnection 114. The lead-out interconnection 114 is formed using the same material as that of the first electrode 110. Therefore, the lead-out interconnection 114 is light-transmitting. In the present example, the lead-out interconnection 114 is formed integrally with the first electrode 110. The lead-out interconnection 114 is connected to the first terminal 112. In the example shown in the drawing, the end of the lead-out interconnection 114 serves as the first terminal 112.

The insulating layer 150 is formed over conductor patterns serving as plural first electrodes 110 and over the substrate 100 between the first electrodes 100. The insulating layer 150 partially covers the upper surfaces of the conductor patterns serving as the first electrodes 110. The insulating layer 150 is formed using a photosensitive resin material, such as, for example, a light-transmitting polyimide-based resin. The insulating layer 150 may be formed using resins other than the polyimide-based resin, for example, an epoxy-based resin or an acrylic-based resin. The refractive index $n_3$ of the insulating layer 150 exists between the refractive index $n_1$ of the substrate 100 and the refractive index $n_2$ of the first electrode 110, and is, for example, equal to or greater than 1.6 and equal to or less than 1.8.

The second electrode 130 is formed on the organic layer 120. Similarly to the first electrode 110, the second electrode 130 is a transparent electrode having a light-transmitting property. A material exemplified as the material constituting the first electrode 110 may be used in a material constituting the second electrode 130. However, the first electrode 110 and the second electrode 130 may be formed using different materials or may be formed using the same material. In addition, the film thickness of the second electrode 130 and a method of forming the second electrode 130 are the same as the film thickness of the first electrode 110 and a method of forming the second electrode 130. However, the film thickness of the second electrode 130 may be different from the film thickness of the first electrode 110.

The second electrode 130 extends in a second direction (X direction in FIG. 1) intersecting the first direction. The partition wall 170 is formed between the second electrodes 130 next to each other. The partition wall 170 extends parallel to the second electrode 130, that is, in the second direction, and is provided in order to separate the second electrodes 130 from each other.

Specifically, the partition wall 170 is formed in a shape which is trapezoidal in cross-section and is turned upside down (inverted trapezoid). That is, the width of the upper surface of the partition wall 170 is larger than the width of the lower surface of the partition wall 170. For this reason, when the partition wall 170 is formed prior to the second electrode 130, plural second electrodes 130 may be collectively formed by forming the second electrodes 130 on one surface side of the substrate 100 by vapor deposition or sputtering. In addition, the partition wall 170 also has a function of partitioning the organic layer 120.

The foundation of the partition wall 170 is, for example, the insulating layer 150. The partition wall 170 is, for example, a photosensitive resin such as a polyimide-based resin, and is formed in a desired pattern by exposure and development. Meanwhile, the partition wall 170 may be formed of a resin other than a polyimide-based resin, for example, an epoxy-based resin or an acrylic-based resin, or an inorganic material such as silicon dioxide.

Meanwhile, the light-emitting device 10 is not required to include the partition wall 170. In this case, the second electrode 130 is formed in a predetermined pattern by using a mask during sputtering or vapor deposition.

In addition, plural openings 152 and plural openings 154 are formed in the insulating layer 150. The opening 152 is located at the point of intersection of the first electrode 110 and the second electrode 130, on a surface parallel to the substrate 100. Specifically, the plural openings 152 are aligned in the extending direction of the first electrode 110 (Y direction in FIG. 1). In addition, the plural openings 152 are also aligned in the extending direction of the second electrode 130 (X direction in FIG. 1). For this reason, the plural openings 152 are arranged to constitute a matrix.

The organic layer 120 is formed in a region overlapping the opening 152. The organic layer 120 includes a light-emitting layer. Therefore, the light-emitting unit 140 is located in each region overlapping the opening 152.

Specifically, the organic layer 120 has a configuration in which, for example, a hole injection layer, a light-emitting layer, and an electron injection layer are laminated. A hole transport layer may be formed between the hole injection layer and the light-emitting layer. In addition, an electron transport layer may be formed between the light-emitting layer and the electron injection layer. The organic layer 120 may be formed by vapor deposition. In addition, at least one layer of the organic layer 120, for example, a layer in contact with the first electrode 110, may be formed by a coating method such as an ink jetting, printing, or spraying. Meanwhile, in this case, the remaining layers of the organic layer 120 are formed by vapor deposition. In addition, all layers of the organic layer 120 may be formed by coating. The hole injection layer of the organic layer 120 is in contact with the first electrode 110, and the electron injection layer of the organic layer 120 is in contact with the second electrode 130.

Meanwhile, in the examples shown in FIGS. 3 and 4, a case is shown in which each of layers constituting the organic layer 120 all protrude to the outside of the opening 152. As shown in FIG. 4, the organic layer 120 may or may not be continuously formed between the openings 152 next to each other in the extending direction of the partition wall 170. However, as shown in FIG. 5, the organic layer 120 is not formed in the opening 154.

In addition, as described above, the light-emitting unit 140 is located in each region overlapping the opening 152. Therefore, to be exact, as shown in FIG. 3, the first electrode 110 may be defined as a region of the conductor pattern serving as the first electrode 110 which overlaps the opening 152, in the extending direction of the conductor pattern serving as the first electrode 110. In the first electrode 110 according to this definition, the edges of the upper surface of the first electrode 110 in a width direction (both ends of the first electrode 110 in FIG. 4) are covered by the insulating layer 150. A portion of the conductor pattern serving as the first electrode 110 which is located between the first electrodes 110 next to each other may be defined as the interconnect 116. The interconnect 116 is covered by the insulating layer 150.

The opening 154 is located in a region overlapping one end side of each of the plurality of second electrodes 130 when seen in a plan view. In addition, the opening 154 is disposed along one side of the matrix constituted by the openings 152. When seen in a direction along the one side (for example, Y direction in FIG. 1, that is, the direction along the first electrode 110), the openings 154 are disposed at a predetermined interval. A portion of the lead-out interconnection 134 is exposed from the opening 154. The lead-out interconnection 134 is connected to the second electrode 130 through the opening 154.

The lead-out interconnection 134 is for electrically connecting the second electrode 130 to a second terminal 132, and includes a layer constituted of the same material as that of the first electrode 110. One end side of the lead-out interconnection 134 is located below the opening 154, and the other end side of the lead-out interconnection 134 is extracted to the outside of the insulating layer 150. In the examples shown in the drawings, the other end side of the lead-out interconnection 134 serves as the second terminal 132.

A conductive member such as a flexible printed circuit (FPC) is connected to the first terminal 112 and the second terminal 132. In the example shown in the drawings, the first terminal 112 and the second terminal 132 are disposed along the same side of the substrate 100. Therefore, in a case where the FPC is used as a conductive member, the first terminal 112 and the second terminal 132 can be connected to one FPC.

In addition, the light-emitting device 10 includes the intermediate layer 200. The intermediate layer 200 is formed in at least a portion (preferably, the entirety) of a region of the lateral side of the first electrode 110 which overlaps the insulating layer 150, and at least a portion (preferably, the entirety) of a region of the lateral side of the interconnect 116 which overlaps the insulating layer 150. In the example shown in the drawings, the intermediate layer 200 is also formed on the lateral side of the first terminal 112, the lateral side of the lead-out interconnection 114, the lateral side of the second terminal 132, and the lateral side of the lead-out interconnection 134. The thickness of the intermediate layer 200 is, for example, equal to or greater than 50 nm and equal to or less than 500 nm.

The refractive index $n_4$ of the intermediate layer 200 is between the refractive index $n_2$ of the first electrode 110 and the refractive index $n_3$ of the insulating layer 150. In order to achieve such a configuration, the intermediate layer 200 may be formed using, for example, both a material constituting the first electrode 110 and a material constituting the insulating layer 150. In this case, the volume content of the material same as that of the first electrode 110 in the intermediate layer 200 is, for example, equal to or greater than 30% and equal to or less than 70%. Meanwhile, the volume content of the material same as that of the first electrode 110 may be replaced with, for example, the area ratio of the material same as that of the first electrode 110 in a cross-sectional photograph of the intermediate layer 200.

In addition, the intermediate layer 200 may be formed using a material containing silicon, oxygen, and nitrogen, such as a silicon oxynitride. In this case, the ratio of the nitrogen content of the intermediate layer 200 to the oxygen content of the intermediate layer 200 is, for example, equal to or greater than 2 and equal to or less than 9. Meanwhile, the ratio can also be replaced with, for example, the ratio of peak heights in X-ray fluorescence (XRF) or energy dispersive X-ray spectroscopy (EDX).

Next, a method of manufacturing the light-emitting device 10 in the present embodiment will be described. First, the first electrode 110, the interconnect 116, the first terminal 112, the second terminal 132, and the lead-out interconnections 114 and 134 are formed over the substrate 100. These components are formed by, for example, sputtering or vapor deposition using a mask. However, these components may be formed using other methods.

Next, the intermediate layer 200 is formed on the lateral side of the first electrode 110, the lateral side of the first terminal 112, the lateral side of the second terminal 132, the lateral side of the interconnect 116, and the lateral sides of the lead-out interconnections 114 and 134. In a case where the intermediate layer 200 is formed using a material constituting the first electrode 110 and a material constituting the insulating layer 150, the intermediate layer 200 is formed by, for example, coating a material constituting the first electrode 110, coating a material constituting the insulating layer 150, and then heat-treating the materials. Meanwhile, the intermediate layer 200 may alternatively be formed by mixing the coating material including the material constituting the first electrode 110 and the coating material constituting the insulating layer 150 in advance, and coating and heat treating the mixed material.

In addition, in a case where the intermediate layer 200 is formed using a material containing silicon, oxygen, and nitrogen, the intermediate layer 200 is formed using a gas phase method such as CVD or a lithographic method.

Next, a photosensitive insulating film serving as the insulating layer 150 is formed over the substrate 100 and the first electrode 110 using, for example, a coating method. Thereafter, the insulating film is exposed and developed, thereby forming the insulating layer 150. In this process, the openings 152 and 154 are also formed. Thereafter, the partition wall 170, the organic layer 120, and the second electrode 130 are formed in this order.

In the present embodiment, the substrate 100, the first electrode 110, and the second electrode 130 are light-transmitting. Therefore, the light-emitting device 10 serves as a transparent display. However, since the refractive index $n_2$ of the first electrode 110 and the refractive index $n_3$ of the insulating layer 150 are different from each other, light is scattered on the interface between the lateral side of the first electrode 110 and the insulating layer 150. As a result, there is the possibility of a user noticing the edge of the first electrode 110. On the other hand, in the present embodiment, at least a portion (preferably, the entirety) of a region of the lateral side of the first electrode 110 which faces the insulating layer 150 is covered by the intermediate layer 200.

The refractive index $n_4$ of the intermediate layer 200 exists between the refractive index $n_2$ of the first electrode 110 and the refractive index $n_3$ of the insulating layer 150. For this reason, light is less likely to be scattered between the lateral side of the first electrode 110 and the insulating layer 150 than in a case where the intermediate layer 200 is not provided, and thus a user is less likely to notice the edge of the first electrode 110.

In addition, the intermediate layer 200 is also formed on the lateral side of the interconnect 116, the lateral side of a portion of the lead-out interconnection 114 which is covered by the insulating layer 150, and the lateral side of a portion of the lead-out interconnection 134 which is covered by the insulating layer 150. Therefore, light is also less likely to be scattered between each of these lateral sides and the insulating layer 150. Therefore, a user is less likely to notice the edge of the interconnect 116, the edge of the lead-out interconnection 114, and the edge of the lead-out interconnection 134.

Second Embodiment

Figure 6:
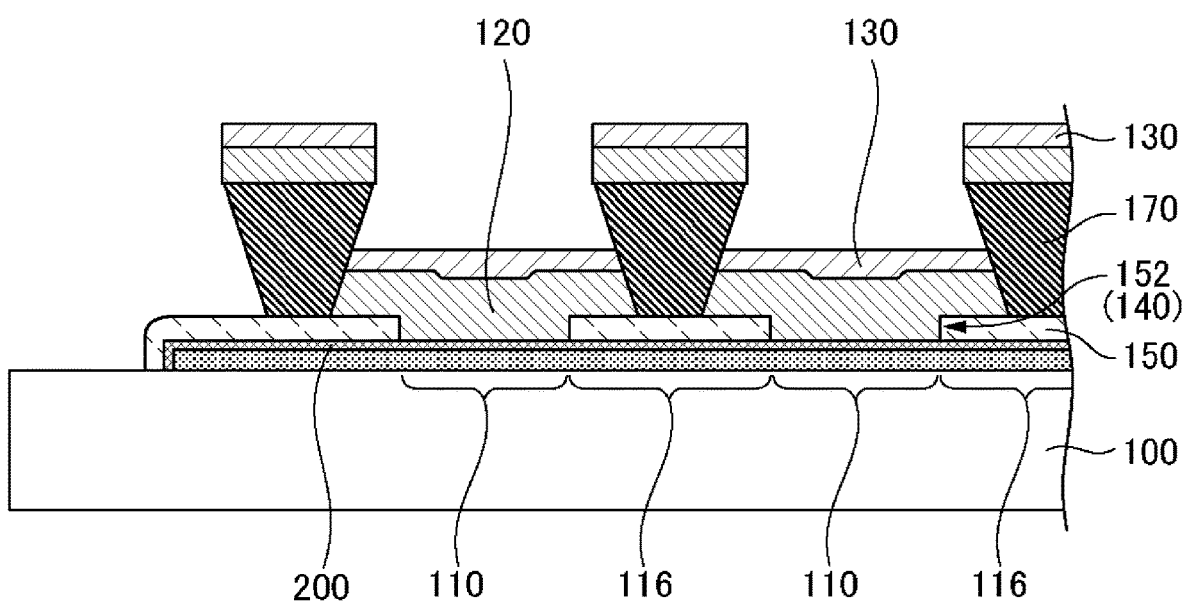
FIG. 6 is a cross-sectional view illustrating a configuration of a light-emitting device according to a second embodiment.
Figure 7:
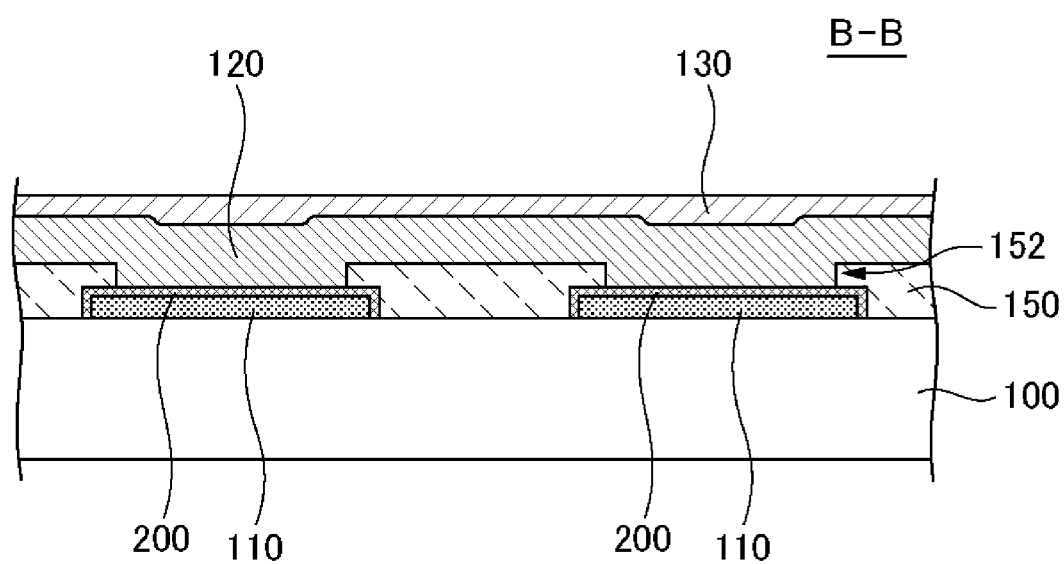
FIG. 7 is a cross-sectional view illustrating a configuration of the light-emitting device according to the second embodiment.
Figure 8:
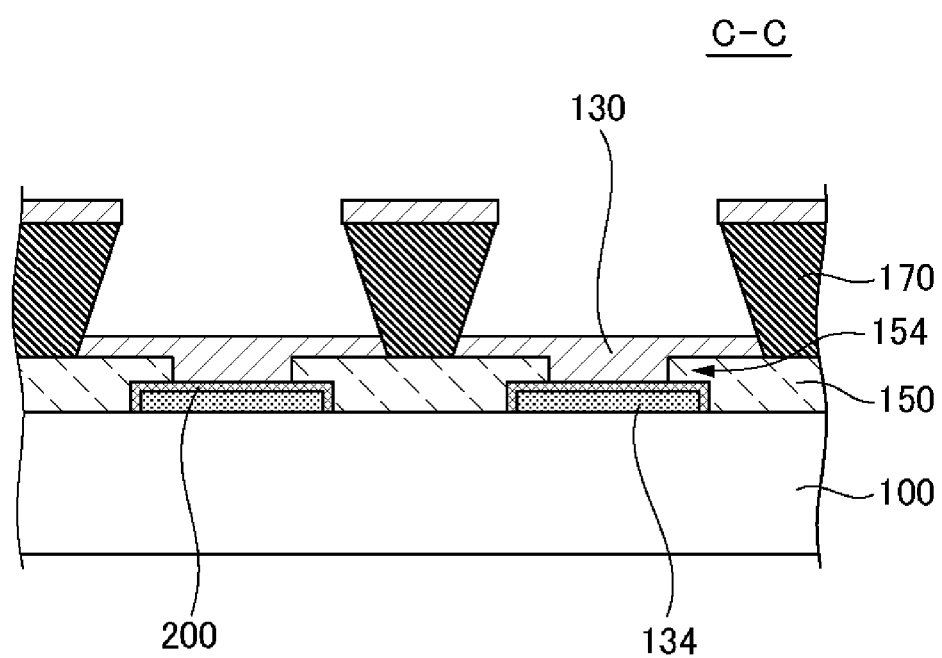
FIG. 8 is a cross-sectional view illustrating a configuration of the light-emitting device according to the second embodiment.

FIGS. 6, 7, and 8 are cross-sectional views of a light-emitting device 10 according to a second embodiment, and correspond to FIGS. 3, 4, and 5 in the first embodiment, respectively. The light-emitting device 10 according to the present embodiment has the same configuration as that of the light-emitting device 10 according to the first embodiment, except for the layout of the intermediate layer 200.

In the present embodiment, similarly to the first embodiment, the insulating layer 150 covers the edges of the upper surface of the first electrode 110 in a width direction (both ends of the first electrode 110 in FIG. 7). As shown in FIGS. 6 and 7, the intermediate layer 200 is formed on at least a portion (preferably, the entirety) of a region of the upper surface of the first electrode 110 which is covered by the insulating layer 150.

In addition, as shown in FIG. 6, the intermediate layer 200 is formed in at least a portion of a region of the upper surface of the interconnect 116 which is covered by the insulating layer 150. In the examples shown in FIGS. 6 and 7, on a cross-section in a direction (Y direction of FIG. 1) orthogonal to the extending direction of the interconnect 116, the insulating layer 150 and the intermediate layer 200 are formed on the entirety of the interconnect 116. In other words, the intermediate layer 200 is formed on the entirety of a region of the interconnect 116 which is covered by the insulating layer 150.

In addition, as shown in FIG. 8, the intermediate layer 200 is formed on the entirety of a region of the lead-out interconnection 134 covered by the insulating layer 150. Similarly, the intermediate layer 200 is formed on the entirety of a region of the lead-out interconnection 114 covered by the insulating layer 150.

In the present embodiment, a user is also less likely to notice the edge of the first electrode 110, the edge of the interconnect 116, the edge of the lead-out interconnection 114, and the edge of the lead-out interconnection 134. In addition, since the intermediate layer 200 is also formed on the upper surfaces of the first electrode 110, the interconnect 116, the lead-out interconnection 114, and the lead-out interconnection 134, the degree of accuracy required for the position of the intermediate layer 200 is reduced, allowing the manufacturing cost of the light-emitting device 10 to be reduced.

Meanwhile, in the first and second embodiments, the intermediate layer 200 may be formed over portions of the substrate 100, including a portion of the substrate 100 located in the vicinity of the first electrode 110, a portion thereof located in the vicinity of the first terminal 112, a portion thereof located in the vicinity of the lead-out interconnection 114, a portion thereof located in the vicinity of the interconnect 116, a portion thereof located in the vicinity of the second terminal 132, and a portion located in the vicinity of the lead-out interconnection 134.

Third Embodiment

Figure 9:
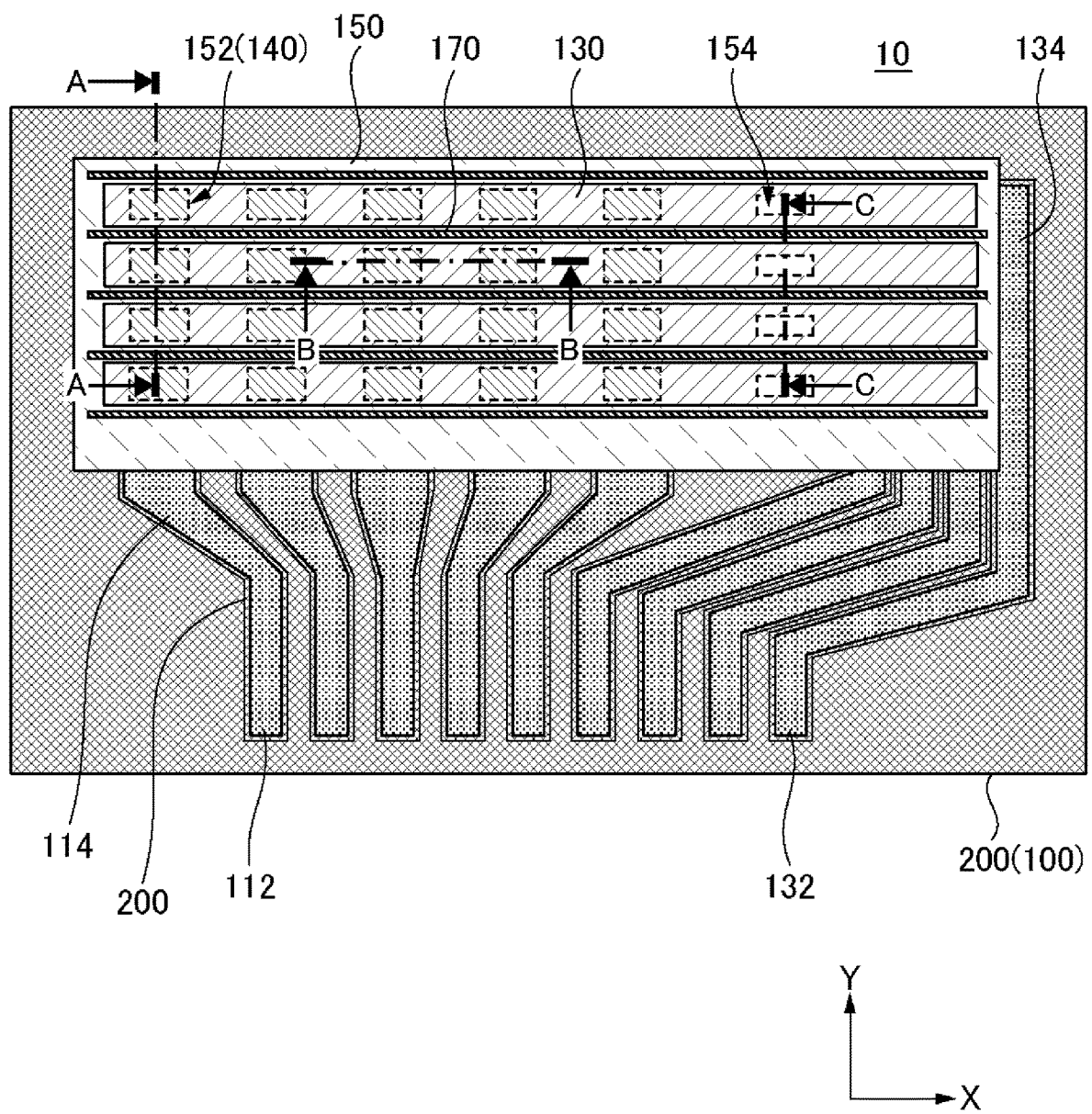
FIG. 9 is a plan view illustrating a configuration of a light-emitting device according to a third embodiment.
Figure 10:
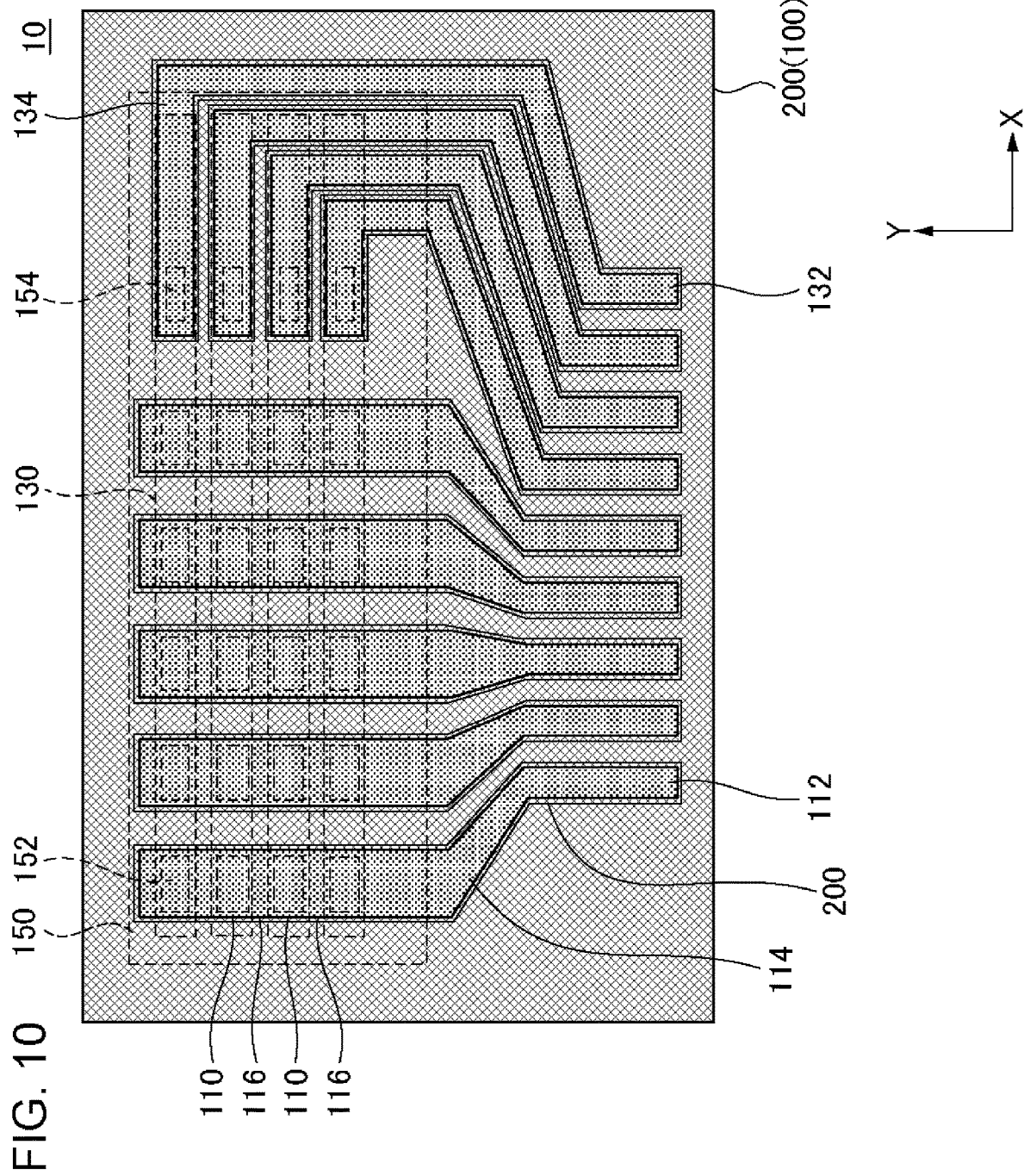
FIG. 10 is a plan view illustrating a configuration of the light-emitting device according to the third embodiment.
Figure 11:
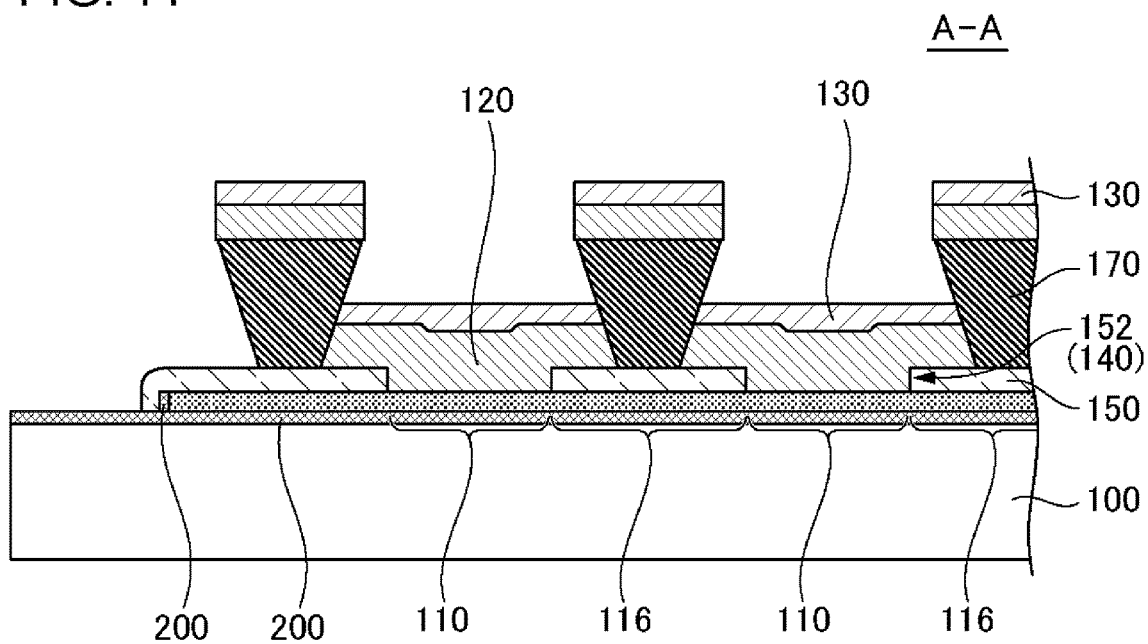
FIG. 11 is a cross-sectional view illustrating a configuration of the light-emitting device according to the third embodiment.
Figure 12:
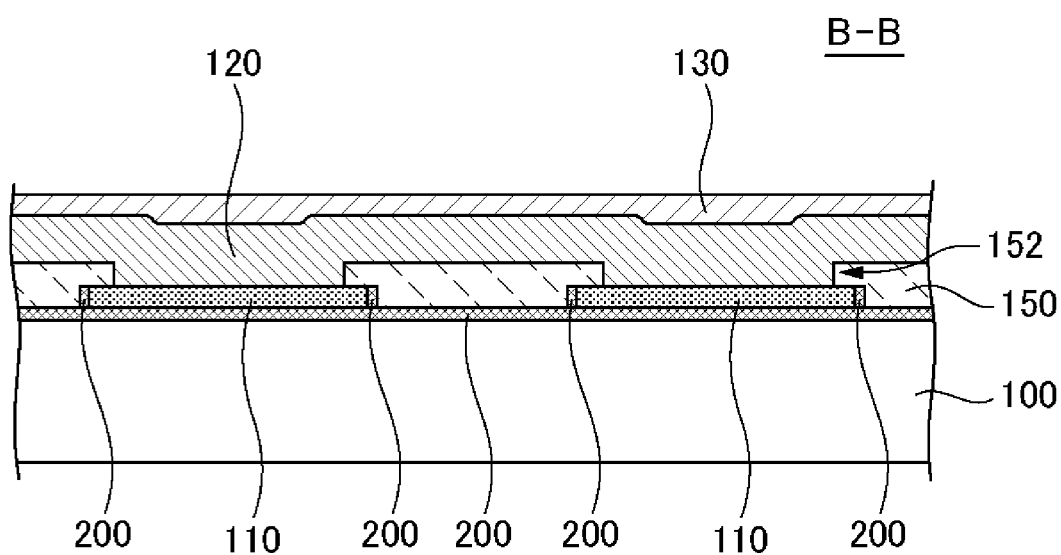
FIG. 12 is a cross-sectional view illustrating a configuration of the light-emitting device according to the third embodiment.
Figure 13:
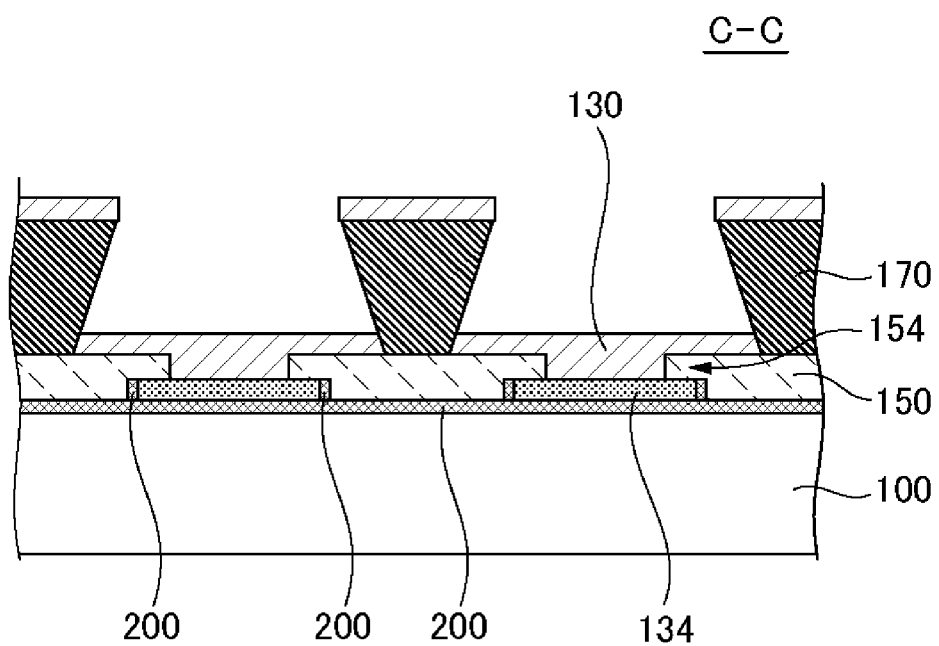
FIG. 13 is a cross-sectional view illustrating a configuration of the light-emitting device according to the third embodiment.

FIGS. 9 and 10 are plan views illustrating a configuration of a light-emitting device 10 according to a third embodiment. FIGS. 11, 12, and 13 are cross-sectional views illustrating a configuration of the light-emitting device 10. FIGS. 9 to 13 correspond to FIGS. 1 to 5 in the embodiment.

The light-emitting device 10 according to the present embodiment has the same configuration as that of the light-emitting device 10 according to the first embodiment, except that the intermediate layer 200 is also provided on a surface of the substrate 100 where the light-emitting unit 140 is formed. Therefore, the intermediate layer 200 is formed in at least a portion (the entirety in the example shown in the drawing) between the substrate 100 and the first electrode 110, at least a portion (the entirety in the example shown in the drawing) between the substrate 100 and the interconnect 116, at least a portion (the entirety in the example shown in the drawing) between the insulating layer 150 located next to the first electrode 110 and the substrate 100, at least a portion (the entirety in the example shown in the drawing) between the insulating layer 150 located next to the interconnect 116 and the substrate 100, at least a portion (the entirety in the example shown in the drawing) between the substrate 100 and the lead-out interconnection 114, and at least a portion (the entirety in the example shown in the drawing) between the substrate 100 and the lead-out interconnection 134. The refractive index $n_4$ of the intermediate layer 200 formed on the substrate 100 exists between the refractive index $n_1$ of the substrate 100 and the refractive index $n_2$ of the first electrode 110.

More specifically, the refractive index $n_3$ of the insulating layer 150 is preferably between the refractive index $n_2$ of the first electrode 110 and the refractive index $n_1$ of the substrate 100, and the refractive index $n_4$ of the intermediate layer 200 is preferably between the refractive index $n_2$ of the first electrode 110 and the refractive index $n_3$ of the insulating layer 150. In addition, $n_4$ is preferably between $\sqrt{(n_1 \times n_2)}$ and $(n_2+n_3)/2$. Further, when the wavelength of a maximum peak of an emission spectrum of the organic layer 120 is $\lambda$, and the thickness of the intermediate layer 200 is d, $0.9\lambda/4 \le n_4 \times d \le 1.1\lambda/4$ and $\sqrt{(n_1 \times n_2)} \le n_4 \le (n_2+n_3)/2$ are preferably true.

Meanwhile, a material of the intermediate layer 200 formed on the substrate 100 is the same as a material of the intermediate layer 200 shown in the first embodiment. However, the intermediate layer 200 formed on the substrate 100 may be different from that of the intermediate layer 200 covering the lateral side of the first electrode 110. In addition, the thickness of the intermediate layer 200 formed on the substrate 100 is, for example, equal to or greater than 50 nm and equal to or less than 500 nm.

According to the present embodiment, the intermediate layer 200 is formed between the first electrode 110 and the substrate 100. The refractive index $n_4$ of the intermediate layer 200 exists between the refractive index $n_1$ of the substrate 100 and the refractive index $n_2$ of the first electrode 110. Therefore, extraction efficiency of light from the organic layer 120 is further improved than in a case where no intermediate layer 200 is provided. In a case where $n_4$ is $\sqrt{(n_1 \times n_2)}$, the extraction efficiency of light from the organic layer 120 is further improved. In addition, in a case where $0.9\lambda/4 \le n_4 \times d \le 1.1\lambda/4$ is true and $n_4$ is $\sqrt{(n_1 \times n_2)}$, extraction efficiency of light from the organic layer 120 is further improved.

In addition, since the refractive index $n_4$ of the intermediate layer 200 is between the refractive index $n_2$ of the first electrode 110 and the refractive index $n_3$ of the insulating layer 150, a user is less likely to visually recognize a portion of the lateral side of the first electrode 110 in contact with the insulating layer 150. In a case where $n_4$ is $(n_2+n_3)/2$, the aforementioned portion of the lateral side of the first electrode 110 is the most less likely to be visually recognized. Therefore, $\sqrt{(n_1 \times n_2)} \le n_4 \le (n_2+n_3)/2$ indicates a condition for achieving superior extraction efficiency of light from the organic layer 120 and less visibility of a portion of the lateral side of the first electrode 110 in contact with the insulating layer 150.

As described above, although the embodiments and examples of the present invention have been set forth with reference to the accompanying drawings, they are merely illustrative of the present invention, and various configurations other than those stated above can be adopted.

The invention claimed is:

1. A light-emitting device comprising:
a light-transmitting substrate;
a light-transmitting interconnect positioned over the substrate;
an insulating layer positioned over the substrate and the interconnect; and
an intermediate layer positioned in at least a portion of a region of a lateral side of the interconnect which overlaps the insulating layer,
wherein a refractive index of the intermediate layer is between a refractive index of the interconnect and a refractive index of the insulating layer.

2. The light-emitting device according to claim 1,
wherein the insulating layer covers at least a portion of an upper surface of the interconnect, and
wherein the intermediate layer is positioned over at least a portion of an upper surface of the interconnect that is covered by the insulating layer.

3. The light-emitting device according to claim 1,
wherein, in a cross-section in a direction orthogonal to an extending direction of the interconnect,
the insulating layer covers an entirety of the interconnect, and
and the intermediate layer is positioned over an entirety of a region of the interconnect that is covered by the insulating layer.

4. The light-emitting device according to claim 3, wherein the interconnect comprises ITO, IZO, Ag, or an Ag alloy.

5. The light-emitting device according to claim 1, wherein the intermediate layer is positioned between the substrate and the insulating layer.

6. The light-emitting device according to claim 1, wherein the intermediate layer comprises a material constituting the interconnect and a material constituting the insulating layer.

7. The light-emitting device according to claim 1, wherein the intermediate layer comprises silicon, oxygen, and nitrogen.

8. A light-emitting device comprising:
a light-transmitting substrate;
a light-transmitting interconnect positioned over the substrate;

an insulating layer positioned over the substrate and the interconnect; and an intermediate layer positioned in at least a portion of a region of a lateral side of the interconnect that overlaps the insulating layer, wherein the intermediate layer comprises a material constituting the interconnect and a material constituting the insulating layer.

9. The light-emitting device, according to claim 8, wherein a thickness of the intermediate layer is equal to or greater than 50 nm.

10. A light-emitting device comprising:

a light-transmitting substrate;

a light-transmitting interconnect positioned over the substrate;

an insulating layer positioned over the substrate and the interconnect; and an intermediate layer positioned in at least a portion of a region of a lateral side of the interconnect that overlaps the insulating layer, wherein the intermediate layer comprises silicon, oxygen, and nitrogen.

11. The light-emitting device according to claim 10, wherein a thickness of the intermediate layer is equal to or greater than 50 nm.

* * * * *